United States Patent
In 'T Zandt et al.

(10) Patent No.: US 9,331,028 B2
(45) Date of Patent: May 3, 2016

(54) ELECTRIC FIELD GAP DEVICE AND MANUFACTURING METHOD

(71) Applicant: NXP B.V., Eindhoven (NL)

(72) Inventors: Michael In 'T Zandt, Veldhoven (NL); Olaf Wunnicke, Eindhoven (NL); Klaus Reimann, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/293,146

(22) Filed: Jun. 2, 2014

(65) Prior Publication Data
US 2015/0001671 A1 Jan. 1, 2015

(30) Foreign Application Priority Data

Jun. 26, 2013 (EP) .................................... 13173864

(51) Int. Cl.
| | |
|---|---|
| *H01L 23/60* | (2006.01) |
| *H01J 9/02* | (2006.01) |
| *H01L 27/02* | (2006.01) |
| *H01L 21/74* | (2006.01) |
| *H01L 21/762* | (2006.01) |
| *H01L 29/06* | (2006.01) |

(52) U.S. Cl.
CPC ................ *H01L 23/60* (2013.01); *H01J 9/025* (2013.01); *H01L 21/74* (2013.01); *H01L 21/76205* (2013.01); *H01L 27/0288* (2013.01); *H01L 29/0615* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 5,401,676 A | 3/1995 | Lee | |
| 5,643,032 A | 7/1997 | Cheng et al. | |
| 5,847,496 A | 12/1998 | Nakamoto et al. | |
| 7,332,398 B2 | 2/2008 | In't Zandt et al. | |
| 2006/0205222 A1 | 9/2006 | In't Zandt et al. | |
| 2009/0280585 A1 * | 11/2009 | Koh et al. | ........................ 438/20 |

FOREIGN PATENT DOCUMENTS

EP          0 802 555 A2      10/1997

OTHER PUBLICATIONS

Bock, K. "ESD-Schutzkonzepte mit Feldemissionsschaltern für Mikrowellenbauelemente und deren integrierte Schaltungen", Fortschritt-Berichte, vol. 185, 163 pgs. (1994) (Non English Document).

Extended European Search Report for EP Patent Appln. No. 13173864.3 (Dec. 5, 2013).

* cited by examiner

*Primary Examiner* — Yu Chen
*Assistant Examiner* — Nilufa Rahim
(74) *Attorney, Agent, or Firm* — Rajeev Madnawat

(57) ABSTRACT

Substrate material is oxidized around side walls of a set of channels. A shielding structure means there is more oxide growth at the top than the bottom with the result that the non-oxidized substrate material area between the channels forms a tapered shape with a pointed tip at the top. These pointed substrate areas are then used to form cathodes.

14 Claims, 6 Drawing Sheets

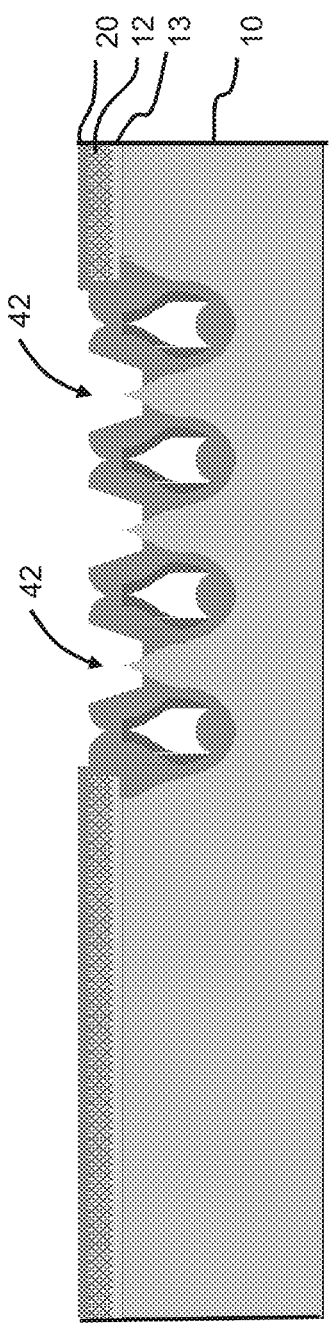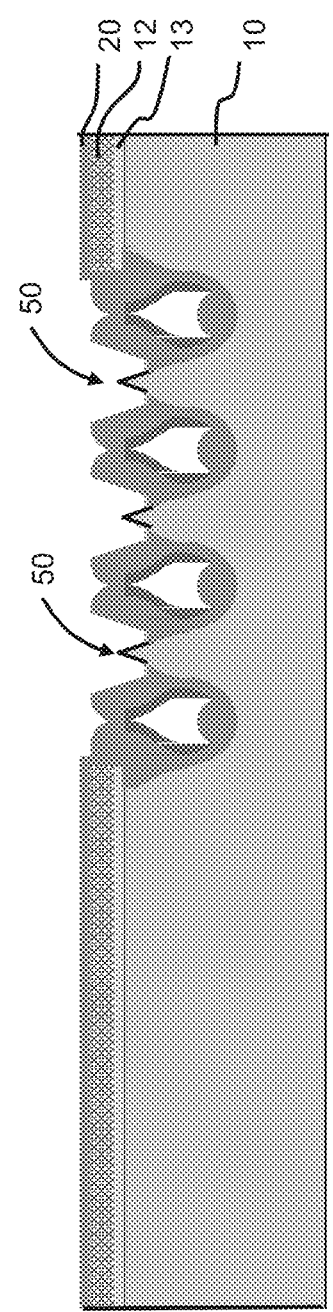

Figure 1:
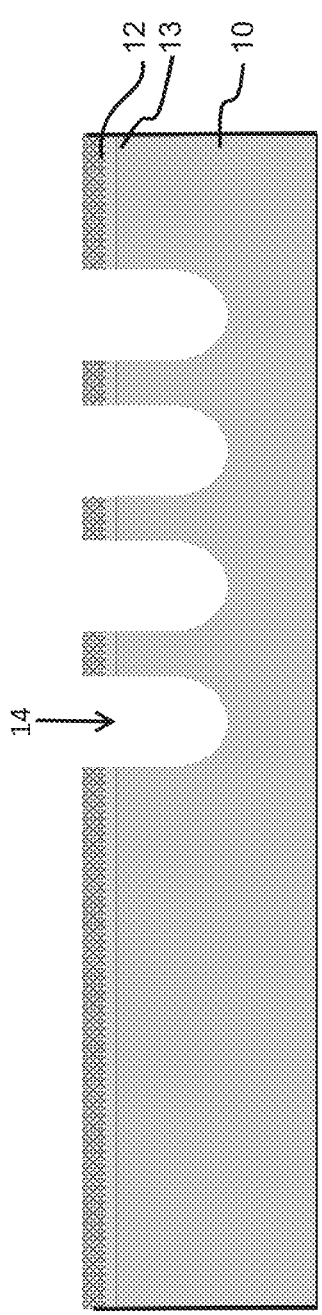

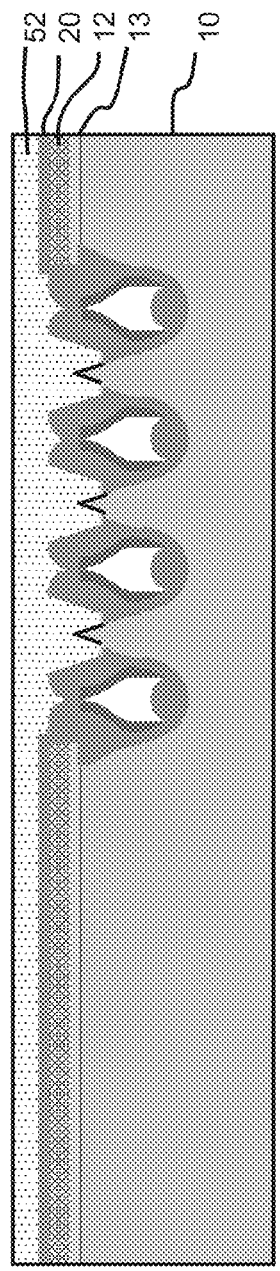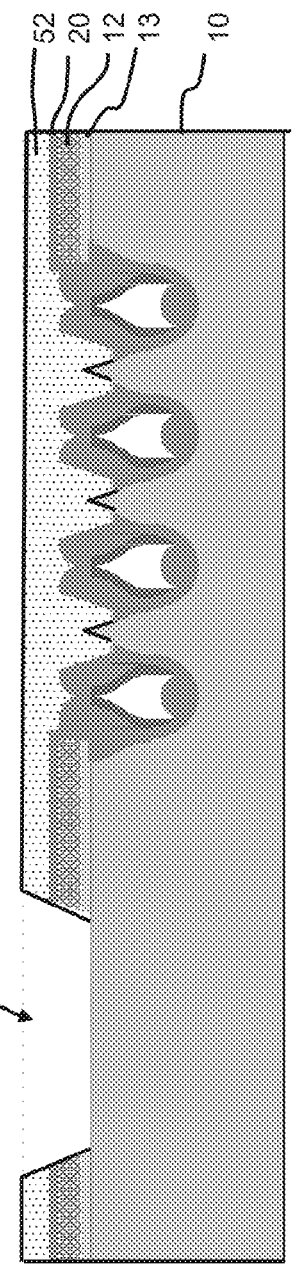
FIG. 8
FIG. 9

ELECTRIC FIELD GAP DEVICE AND MANUFACTURING METHOD

CROSS-REFERENCE TO RELATED APPLICATIONS

This application claims the priority under 35 U.S.C. §119 of European patent application no. 13173864.3, filed on Jun. 26, 2013, the contents of which are incorporated by reference herein.

This invention relates to electric field gap devices, by which is meant devices that make use of a small gap between a cathode and an anode, across which an electric field is established.

Electrostatic discharge (ESD) protection devices are one example of such devices. These devices are used for protecting integrated circuits from damage caused by electrostatic discharge. The voltage in a discharge event can reach thousands of volts, whereas circuit components may need to be protected to prevent voltages exceeding for example 10V.

Many ESD protection devices are available, such as a coil and capacitance coupled to ground, or dedicated components like spark-gaps or varistors. The drawback of many of these devices is that there is a trade-off between a low and constant capacitance and a low overshoot voltage.

For some applications (e.g. antennas), a combination of both a constant capacitance and a relatively low overshoot voltage is required.

Theoretical simulations show that a way to overcome a non-linear capacitance and a high overshoot voltage is by use of field emission. This approach makes use of a pair of spaced metal points which serve to initiate a field emission discharge.

The structure requires two electrodes with a relatively narrow gap in between (e.g. 50 nm) to allow electrons to travel from one electrode to the other and possible also with the requirement of not creating a spark. A spark might nevertheless be formed for strong discharge events. A narrow gap also enables low overshoot voltages.

An example of field emission ESD protection devices is disclosed in U.S. Pat. No. 5,933,718. This is aimed at improving the reliability of forming a specific gap size using the same structure as used for a gate stack.

To enhance the field emission effect, creating sharp tips at (at least) one electrode is preferred.

The invention aims to provide an improved process and structure for providing an electric field gap device, in particular with a set of sharp electrode tips The invention is defined by the claims.

The invention provides a method of forming an electric field gap device, comprising:
  providing a silicon substrate;
  etching cathode channels into the substrate;
  lining the resulting surface with a lining dielectric layer;
  forming shielding regions on the cathode channel side walls but leaving an unshielded portion at the top of the cathode channels;
  oxidising the substrate at the unshielded portion of the cathode channels, thereby to leave pointed non-oxidised substrate regions between the cathode channels;
  etching away the layers at and above the pointed substrate regions;
  providing a cathode contact over each pointed substrate region;
  forming a sacrificial layer over the cathode contacts;
  providing an anode metal layer over the sacrificial layer;
  etching the sacrificial layer to form a cavity between the cathode contacts and the anode metal layer.

This process involves oxidising the silicon substrate material around side walls of a set of channels.

A shielding structure means there is more oxide growth at the top than the bottom with the result that the non-oxidised substrate material area between the channels forms a tapered shape with a pointed tip at the top. These pointed substrate areas are then used to form cathodes. The term "cathode channel" is simply used to denote that the channels form a role in the formation of the cathodes—the cathode contacts are not actually formed in the channels. Instead, cathode channels can define a substrate area between the channels, in the form of an array of pillars or stripes on which the cathode contacts are to be formed.

The anode-cathode gap is formed by a sacrificial etching process, so it can be accurately controlled. In particular, the thickness of the sacrificial layer over the cathode metal contacts is selected to correspond to the desired anode-cathode gap.

The structure is preferably a field emission ESD protection structure. The pointed structure defines the cathode. Two similar structures, with opposite polarity, can be connected to a circuit that needs to be protected. so that protection can be provided for ESD events of both polarities. The anode can be a thick layer with good heat conductivity, used to transport the heat induced by the electrostatic discharge.

A first dielectric layer can be formed over the substrate before etching the cathode channels through the first dielectric layer and into the substrate. This functions as oxidation barrier.

The lining dielectric layer can comprise silicon dioxide, and the shielding regions comprise silicon nitride. The silicon nitride can be used as a shield for the oxidisation process.

A capping layer can be formed over the anode metal layer which covers sacrificial etch holes in the anode metal layer. The capping layer can be formed under reduced pressure (e.g. vacuum) so that a cavity is formed which prevents an arc being formed in the anode-cathode gap.

Oxidising the substrate at the unshielded portion of the cathode channel can comprise using a LOCOS process.

The invention also provides an electric field gap structure, comprising:
  a silicon substrate;
  cathode channels extending into the substrate, wherein the tops of the channel side walls comprises oxidised substrate material, such that tapered non-oxidised substrate regions are present between adjacent channels, wherein the top of each substrate region comprises a pointed cathode contact area coated with a cathode metal;
  a cavity above the pointed cathode contacts; and
  an anode metal layer over the cavity layer.

This structure has shaped substrate areas made to form pointed cathode contacts.

The cathode channels can comprise silicon nitride side wall portions within the cathode channels, and silicon dioxide portions which are wider at the top than the bottom of the channels.

Figure 2C:
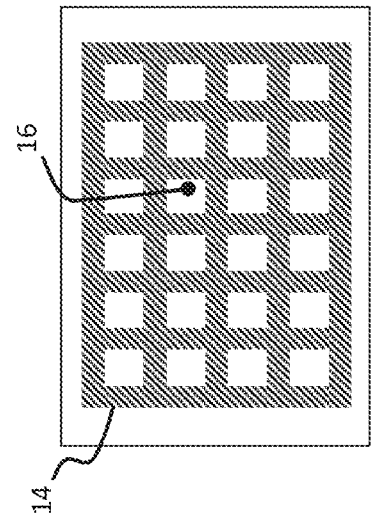
Figure 2B:
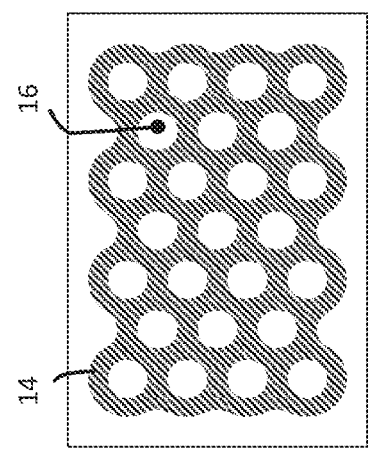
Figure 2A:
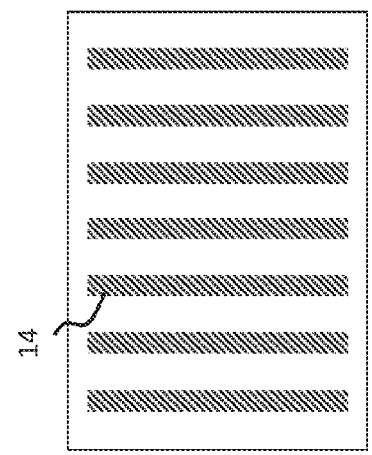

An example of the invention will now be described in detail with reference to the accompanying drawings, in which:
  FIG. 1 shows a first stage in the process of an example of the method of the invention;
  FIGS. 2A-2C shows three possible layouts for the cathode channels;
  FIGS. 3-12 show subsequent stages in the process; and
  FIG. 13 shows the final device in accordance with the invention.

The invention provides a method of forming an electric field gap structure, for example which can be used as a field emission ESD protection structure, in which substrate material is oxidised around side walls of a set of channels. A shielding structure means there is more oxide growth at the top than the bottom with the result that the non-oxidised substrate material area between the channels forms a tapered shape with a pointed tip at the top. These pointed substrate areas are then used to form cathodes.

Figure 12:
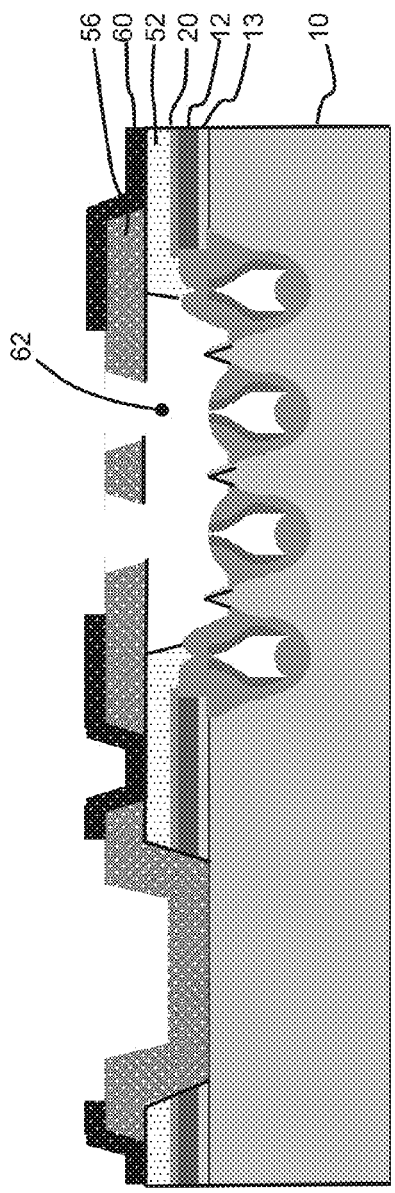
Figure 13:
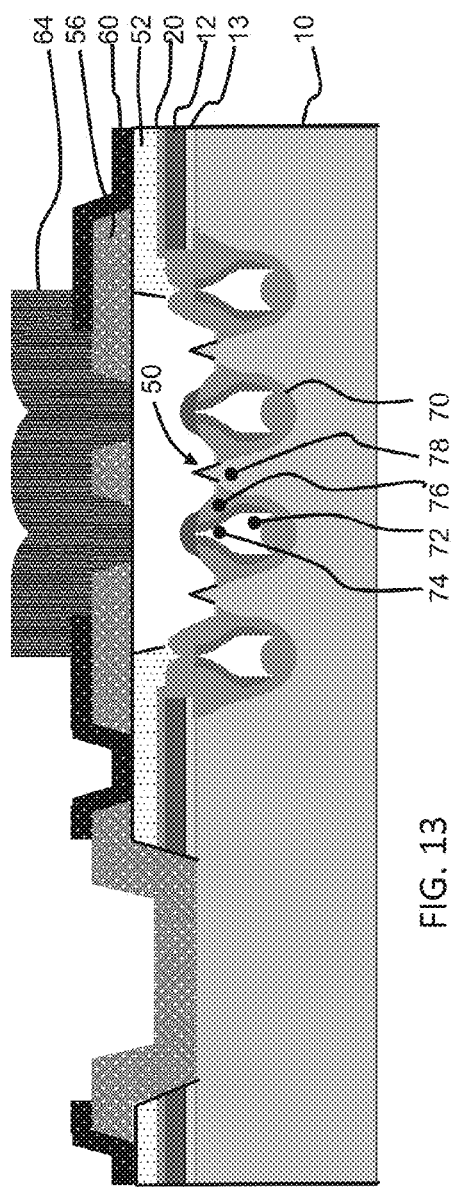

The various stages in the process used to manufacture the device will be described with reference to FIGS. 1-13, in which FIG. 13 shows the final device. It is noted that the dimensions and thicknesses shown in the drawings are not to scale.

FIG. 1 shows a silicon substrate 10, over which a silicon nitride layer 12 is deposited preferably with a thin (e.g. 10 nm) silicon dioxide layer 13 in between to avoid mechanical stress in the silicon substrate. The two layers 12,13 can be considered as sub-layers of a first dielectric layer for providing shielding from a subsequent oxidation process.

The silicon nitride 12 may also be formed from other dielectric materials such as a silicon oxynitride (SiON) as long as this layer 12 prevents the silicon surface from oxidation later in the process. The thickness of layer 12 depends in part on the desired anode-cathode distance of the final device structure (e.g. 500 nm) and the resistivity of this layer against dry/wet etching steps further in the process.

After photolithography, the two layers 12 and 13 are etched, followed by a trench etch in the silicon substrate 10. These etch steps are preferably done with a reactive ion etch (RIE) to enable good control of the desired dimensions. The resulting structure is shown in FIG. 1.

The trenches 14 are structured in either a stripe layout to create wedges or a circular/square layout to create cones/pyramids. Also other layouts are possible like a triangular layout.

FIGS. 2A-2C shows three possible trench patterns in plan view. In FIG. 2A, the trenches are parallel stripes, in FIG. 2B they form interlinked rings, which thus define an array of circular non-etched columns 16 and in FIG. 2C they form a square grid defining an array of square non-etched columns 16. Other layouts can be considered such as a hexagonal or triangular layout.

These trenches can be thought of as cathode channels since they are used to later form the cathode contacts.

Figure 3:
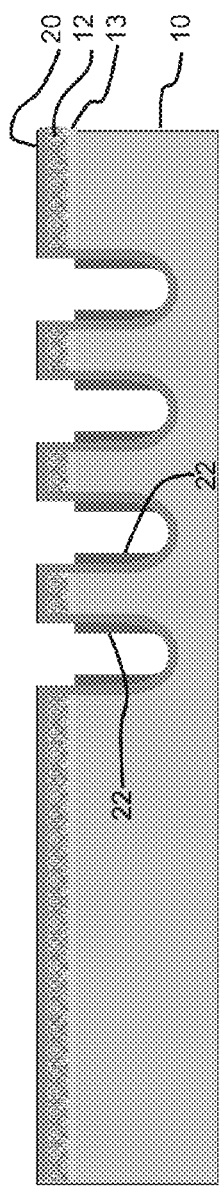

Refer to FIG. 3. After creating the trenches, a thin (e.g. 10 nm) silicon dioxide layer 20 (a second dielectric layer which can be considered to be a lining layer) is deposited or thermally grown and a silicon nitride layer 22 (e.g. 20 nm) is deposited and anisotropically etched to create silicon nitride spacers at the sidewalls of the trenches 14. These spacers function as shielding regions, as they are used to control which parts of the silicon substrate are later oxidised, and thus control the shaping of the substrate. By tuning the thicknesses of the two layers 20, 22, the shape of the sharp tips can be controlled.

The spacer etch requires an amount of overetch, so that the top part of the spacers 22 is around or just below the level of the surface of the silicon substrate 10.

With a wet thermal oxidation, the silicon is locally oxidized (LOCOS) and the remaining silicon between the trenches will be reshaped into a structure having sharpened tips. The spacer design means that the oxygen diffusion length through the silicon dioxide layer 20 is minimized during the thermal oxidation of the LOCOS Essentially, the LOCOS process converts regions of the silicon substrate into silicon dioxide regions. By oxidizing the silicon locally (LOCOS) the oxygen consumes silicon and turns it into silicon dioxide. The silicon nitride blocks the oxygen from reaching the silicon. The oxygen only reaches the silicon when the silicon is directly exposed to the oxygen or when the oxygen diffuses through an existing silicon dioxide layer.

The silicon nitride layer is pushed away during the LOCOS process since the volume of the silicon dioxide is roughly twice the volume of silicon.

The silicon nitride spacers act as shields to protect the lower part of the channels, so that the oxidation occurs preferentially at the top of the channels, such that the amount of original silicon between the tops of adjacent channels is narrowed to form a wedge or cone shape.

The bottom parts of the trenches are locally oxidized as a result of the absence of silicon nitride after the silicon nitride spacer etch. The silicon dioxide in the bottom of the trenches has no further function.

Figure 4:
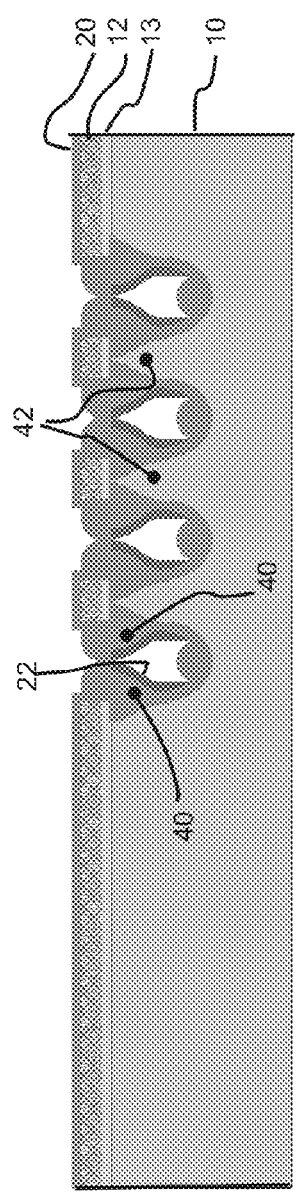

FIG. 4 shows the resulting structure. The LOCOS regions where the silicon has been oxidised are shown as 40 and sharp shapes 42 of silicon substrate remain. These are used to form cathode tips. The shape of the remaining silicon can be tuned very well with a good uniformity by varying the trench depth, the distance between the trenches, the layer thicknesses of layers, the height of the silicon nitride spacer 22 (i.e. how much of the top of the channel is left unshielded) and the LOCOS oxidation time.

Figure 5:
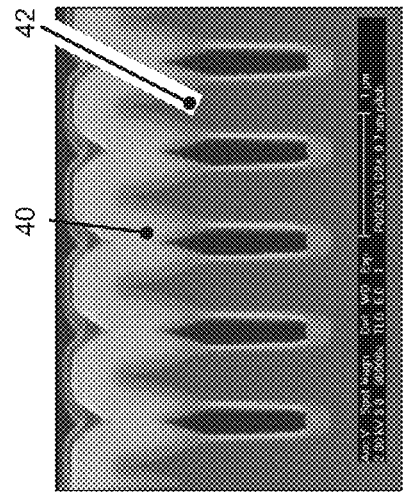

FIG. 5 shows a scanning electron micrograph of the structure at this stage in the process.

After photolithography, the silicon dioxide layer 20 and silicon nitride layer 12 are wet etched or preferably etched with reactive ion etching (RIE) with a high selectivity towards silicon, in such a way that the sharp silicon tips 42 are released. This can be a two or three step etch process so that layers 20, 12 and 13 are etched after each other. Reactive ion etch chemistries to etch silicon nitrides are not very selective towards silicon so after etching layer 20, layer 12 can be etched while stopping on layer 13. Layer 13 is then etched with another etch chemistry that is highly selective towards the silicon. This can even be a wet etch chemistry.

The resulting structure is shown in FIG. 6. As shown, the material layers above the sharpened silicon tips 42 are removed, to define an array of these tips.

Refer to FIG. 7. The silicon tips 42 are then covered by a cathode metal 50 by means of physical vapour deposition, atomic layer deposition, electrochemical growth, silicidation or other known techniques. Depending on the deposition/growth technique, the cathode metal needs to be structured with photolithography and etching afterwards.

Examples of the cathode metal are silicides such as nickel silicide, titanium silicide, tungsten silicide, cobalt silicide or metal stacks like, titanium-tungsten alloy and gold, titanium tungsten alloy and platinum, titanium tungsten alloy and palladium, or titanium tungsten alloy and tungsten. A single layer of titanium tungsten alloy or gallium arsenide is also possible.

Refer to FIG. 8. A sacrificial layer 52 is deposited such as silicon dioxide or TEOS to fill the holes/trenches around the silicon tips 42 again and to define the anode-cathode distance. Preferably, this sacrificial layer can be made smoother by chemical mechanical polishing and the silicon nitride layer 12 can be a stopping layer.

A contact can be made to the silicon substrate at the front side, but also the back side of the silicon substrate can be used as contact and this may be advantageous for series resistance control. To create a contact at the front side, after photolithography a contact window 54 can be etched through layers 52, 20, 12, 13 down to the silicon substrate as shown in FIG. 9.

Figure 10:
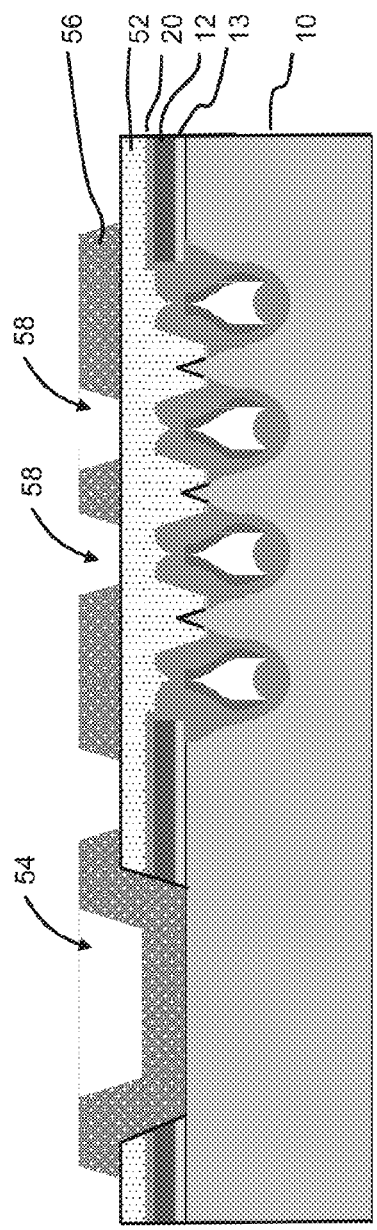

An anode metal 56 is then deposited, that can be combined with the contact metal deposition in the contact window 54. The metal is structured and also release holes 58 are etched in the metal as shown in FIG. 10.

The anode metal can be the same as the cathode layer, such as titanium tungsten alloy and gold, titanium tungsten alloy and tungsten, titanium tungsten alloy and aluminium, etc.

Figure 11:
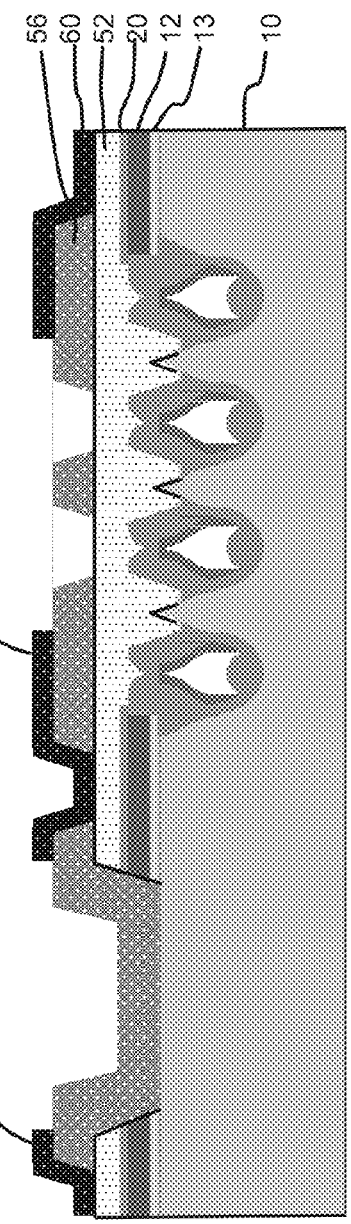

Refer to FIG. 11. A dielectric layer 60 is deposited and structured to protect the dielectric layers 12,13,20,52 outside the active area (the active area being the area where the cathode-anode gaps are to be formed), against the sacrificial etch chemistry and to give the device more mechanical strength.

The sacrificial layer 52 is isotropically etched and the cathodes are released as shown in FIG. 12.

This sacrificial etch forms a cavity 62 over the electrode tips 42.

During this sacrificial etch, also the LOCOS will partly be etched but it is more resistive to this etch process.

Finally, a capping layer 64 is deposited and structured that can be either a dielectric layer (e.g. silicon nitride) or a metal layer (e.g. aluminium) and structured. In case of a dielectric layer, the anode metal layer should be stretched out to be able to make a contact outside the active area. This is also desired to avoid too much mechanical force on the capping layer during bonding This last capping step can also be replaced by wafer to wafer bonding techniques that are commonly used to create cavities.

The final product has an anode-cathode gap defined by the thickness of the sacrificial layer 52 which can be accurately controlled. The sharpened cathode tips improve the ESD performance of the device.

In the example of FIG. 13, the cathode channels remain partially in the end product. The remaining cathode channels 70 are not the same height/depth at the original channels 14 as a result of the etching to expose the cathode tips. However, they nevertheless extend into the substrate 10. FIG. 13 also shows a cavity part having a base 72 which is wider than the top 74. However, this cavity is the result of the distance between the trenches 14 and the chosen LOCOS thickness. If the cathodes 78 are placed at a greater distance from each other, no cavities 72 are formed and the silicon dioxide in the bottom of the trenches will be partly etched as well during the sacrificial etch.

The tops 76 of the channel side walls comprise the oxidised substrate material, such that tapered non-oxidised substrate regions 78 are present between adjacent channels 70. The top of each substrate region has the pointed cathode contact area coated with the cathode metal.

Silicon nitride side wall portions (i.e. layer 22) also line at least part of the cavity area, and silicon dioxide portions remain which are wider at the top than the bottom of the channel.

The sharp tips define the cathode since electrons will escape easier from these tips due to the field enhancement. Two similar structures, with opposite polarity, can be connected to the circuit that needs to be protected. The heat induced by the electrostatic discharge can easily be transported via a relatively thick layer with good heat conductivity.

By making use of an on-wafer capping technique, a vacuum can be created inside the cavity that avoids arcing between the cathode and anode. Vacuum PVD/PECVD processes can be used for the capping process. Alternatively, the device can be used as an arc gap device.

The device can be formed as a discrete ESD protection device.

The example above is based on an ESD protection device. However, the invention relates more generally to devices which make use of an accurately sized electric field gap between an anode and a cathode. There are various devices where small gaps with locally enhanced electrical fields are used.

The example above is based on an ESD protection device. However, the invention relates more generally to devices which make use of an accurately sized electric field gap between an anode and a cathode. There are various devices where small gaps with locally enhanced electrical fields are used. Examples are field emission triodes, light or electron sensors, and some types of display.

Various modifications will be apparent to those skilled in the art.

The invention claimed is:

1. A method of forming an electric field gap structure, comprising:
    providing a silicon substrate;
    etching cathode channels into the substrate, the cathode channels being defined in part by sidewall surfaces;
    lining the top surface of the substrate and the sidewall surfaces of the cathode channels with a lining dielectric layer, wherein the lining dielectric layer leaves the cathode channels open;
    after the lining, forming shielding regions on the sidewall surfaces of the cathode channels but leaving an unshielded portion at the top of the cathode channels, wherein the shielding regions leave the cathode channels open;
    oxidising the substrate at the unshielded portion of the cathode channels so that oxidation occurs at the top of the cathode channels such that an amount of original silicon of the silicon substrate between tops of adjacent cathode channels is narrowed to form pointed non-oxidised substrate regions between the cathode channels;
    etching away the layers at and above the pointed substrate regions;
    providing a cathode contact over each pointed substrate region;
    forming a sacrificial layer over the cathode contacts;
    providing an anode metal layer over the sacrificial layer;
    etching the sacrificial layer to form a cavity between the cathode contacts and the anode metal layer.

2. A method as claimed in claim 1, comprising forming a first dielectric layer over the substrate before etching the cathode channels through the first dielectric layer and into the substrate.

3. A method as claimed in claim 2, wherein the first dielectric layer comprises a plurality of sub-layers.

4. A method as claimed in claim 2, wherein the first dielectric layer comprises silicon nitride.

5. A method as claimed in claim 1, wherein the lining dielectric layer comprises a thin layer of silicon dioxide, and the shielding regions comprise a thin layer of silicon nitride.

6. A method as claimed in claim 1, wherein the sacrificial layer comprises silicon dioxide or TEOS.

7. A method as claimed in claim 1, further comprising forming a capping layer over the anode metal layer which covers sacrificial etch holes in the anode metal layer.

8. A method as claimed in claim 1, wherein the thickness of the sacrificial layer over the cathode contacts is selected to correspond to the desired anode-cathode gap.

9. A method as claimed in claim 1, wherein oxidising the substrate at the unshielded portion of the cathode channel comprises using a LOCOS process.

10. A method as claimed in claim 1, wherein the cathode channels define a substrate area between the channels, in the form of an array of pillars or stripes on which the cathode contacts are to be formed.

11. An electric field gap structure, comprising:
   a silicon substrate;
   cathode channels extending into the substrate, wherein the tops of the channel side walls comprises oxidised substrate material, such that tapered non-oxidised substrate regions are present between adjacent channels, wherein each tapered non-oxidised substrate region has a top, wherein the top of each tapered non-oxidised substrate region comprises a pointed cathode contact area coated with a cathode metal;
   silicon nitride side wall portions on the side walls of the cathode channels, wherein the oxidised substrate material comprises silicon dioxide portions which are between the silicon nitride side wall portions and the tapered non-oxidised substrate regions and which are wider at the top than at the bottom of the channels;
   a cavity above the pointed cathode contacts; and
   an anode metal layer over the cavity layer.

12. A structure as claimed in claim 11, comprising a lining dielectric layer over the substrate and extending into the channels.

13. A structure as claimed in claim 11, wherein the anode metal layer has sacrificial etch holes, and the structure further comprises a capping layer over the anode metal layer which covers the sacrificial etch holes.

14. A structure as claimed in claim 11, further comprising a cathode contact to the substrate formed at an area outside the area where the cathodes are formed.

* * * * *